(12) United States Patent
Dunsmore et al.

(10) Patent No.: US 7,054,780 B2
(45) Date of Patent: May 30, 2006

(54) NETWORK ANALYZER APPLYING LOSS COMPENSATION USING PORT EXTENSIONS AND METHOD OF OPERATION

(75) Inventors: Joel Dunsmore, Sebastopol, CA (US); Doug Bender, Santa Rosa, CA (US); David Blackham, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/939,861

(22) Filed: Sep. 13, 2004

(65) Prior Publication Data
US 2006/0074582 A1   Apr. 6, 2006

(51) Int. Cl.
*G06F 19/00* (2006.01)
(52) U.S. Cl. .................. 702/117; 324/763; 714/100

(58) Field of Classification Search ................ 702/117, 702/118, 182–185, 188; 714/100, 4, 5, 25, 714/30, 48, 1; 707/1
See application file for complete search history.

(56) References Cited

U.S. PATENT DOCUMENTS

2002/0119797 A1*  8/2002  Woodhead et al. ......... 455/522

\* cited by examiner

*Primary Examiner*—Edward Raymond

(57) ABSTRACT

In one embodiment, a method of operating a network analyzer, comprises applying a stimulus signal on at least one port of the network analyzer for provision to a device under test (DUT) within a test fixture coupled to the network analyzer; generating measurement data from the DUT in response to the stimulus signal on at least one port of the network analyzer; and generating an amplitude response of the DUT across a frequency range, wherein a port extension module of the network analyzer automatically applies loss compensation to the amplitude response in a manner that is non-linearly related to frequency according to at least one controllable parameter.

45 Claims, 4 Drawing Sheets

NETWORK ANALYZER APPLYING LOSS COMPENSATION USING PORT EXTENSIONS AND METHOD OF OPERATION

TECHNICAL FIELD

The present application is generally related to calibrating network analyzers to perform measurements using test fixtures.

BACKGROUND OF THE INVENTION

Network analyzers are devices that are used to determine the radio frequency (RF) characteristics of various devices under test (DUTs). In many situations, a DUT is a relatively small component designed to interface with a trace contact point on a printed circuit board (PCB). Many network analyzers typically utilize an interface adapted to receive a coaxial coupling. To test a DUT designed to be employed on a PCB using such a network analyzer, a test fixture is often employed. A test fixture is generally a specialized device that is adapted to readily accept a DUT and that electrically couples the DUT to one or several ports of a network analyzer.

For many DUTs (such as balanced filters, baluns, balanced amplifiers, etc.), the pertinent performance measurements depend upon both the magnitude and phase of the signals applied to and received at each port. In the case of balanced devices, it is quite important that the loss of each port be identical between the balanced pairs of ports. However, the use of network analyzers and test fixtures to perform such measurements presents difficulties. Specifically, it is common to experience different path lengths on different ports using test fixture/network analyzer configurations. The variations may result from PCB layout constraints, manufacturing process limitations, and/or other reasons. The variations between ports may cause the loss to vary between the port thereby reducing the accuracy of the measurements of a DUT using the test fixture. The amplitude loss in the test fixture may cause a properly functioning part to fail insertion loss tests. The amplitude loss can also make matching measured results to model predictions difficult.

De-embedding an S-parameter description of the test fixture has been used to address loss in the text fixture. In known implementations, de-embedding requires a network analyzer to be operated in an error correction mode and involves multiple analyzer sweeps to generate measurement data to be corrected. The measurement data is then processed on an off-line basis by applying one or several error correction arrays using matrix operations. Also, known error correction arrays are statically defined in error correction files. Furthermore, the error correction arrays involve a one-to-one relationship between error terms and the spectral data. Accordingly, it is often the case that the requirements for de-embedding a test fixture are difficult and are often not practical in normal manufacturing environments.

SUMMARY

Some representative embodiments provide port extension functionality of a network analyzer to compensate for the loss introduced by a test fixture. The port extension functionality may involve multiple parameters per port to model the non-linear loss response associated with a network analyzer. After the various parameters of a given port are calibrated, the network analyzer automatically provides amplitude correction to measurement data on a non-linear frequency dependent basis.

Additional representative embodiments are directed to systems and methods for automatically calibrating a network analyzer that includes loss compensation port extension functionality. Specifically, S11 measurements of a known reflection are made from which phase and amplitude references can be generated. "S11 measurements" refer to measurements made by a network analyzer using a scattering parameter model where "S11" refers to the ratio of a reflected signal to an incident signal on the same port. The known reflection may result from an open circuit (e.g., omitting the DUT from the test fixture) and/or a short circuit. Processing of the measurement data may be performed to account for errors in the amplitude response that result from poor source/PCB match of the test set-up. The processing enables a greater degree of accuracy in the calculation of the loss presented by the various port connections to the test fixture.

DETAILED DESCRIPTION

Figure 1:
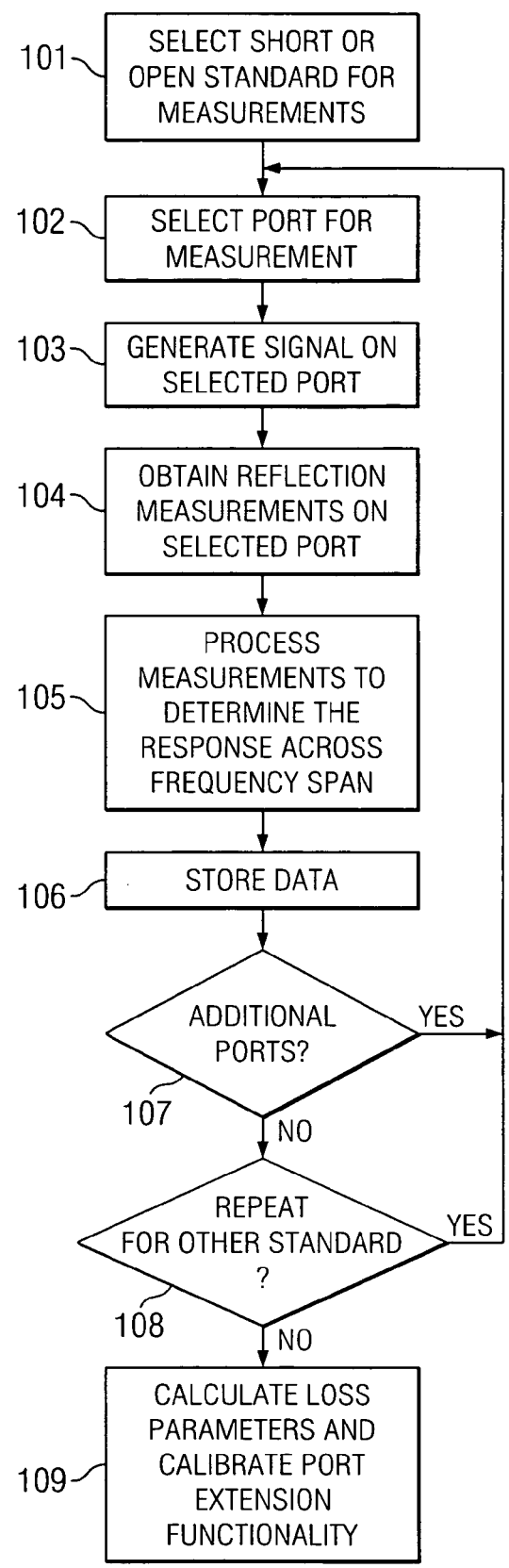
FIG. 1 depicts a flowchart according to one representative embodiment.

Known port extension functionality refers to processing performed by a network analyzer to correct the delay resulting from the extension of a port of the network analyzer to a DUT using, for example, a test fixture. Known port extension applies a relatively simple linear model of phase response of a test fixture to correct measurement data in real-time during operation of a network analyzer. Known port extension functionality does not account for loss introduced by the test fixture. Specifically, the amplitude response of a test fixture is substantially more complicated than the linear model used for phase compensation and, hence, known port extensions are not capable of applying known amplitude correction techniques to measurement data in real-time.

Some representative embodiments provide port extension functionality in a network analyzer to correct for the amplitude response of a test fixture. Specifically, some representative embodiments employ a formula that models loss introduced by a test fixture as a function of frequency. After measurement data is obtained by the network analyzer, the port extension functionality applies a gain to an S-parameter in proportion to the loss defined by the formula and parameters associated with the respective port connection(s) to the test fixture. Because a suitable formula can be employed to generate the gain, the port extension functionality can apply the loss compensation in real-time. Specifically, numerically intensive error matrices need not be applied. Accordingly, the loss compensation can be applied concurrently with the occurrence of analyzer sweeps and the display of resulting spectral data.

The particular fitting formula is preferably selected to represent the expected loss function of the transmission line used to model the characteristics of the test fixture. In one representative embodiment, the following formula is used to model the loss associated with a network analyzer/test fixture set-up:

$$\text{Loss}(f) = a \cdot f^{1/2} + b \cdot f + c, \quad \text{equation (1)}$$

where f is frequency and a, b, and c are constants. The parameter c is the loss at DC and the parameters a and b can be determined by suitably processing measurement data associated with the test fixture. For pure coaxial lines in air, this loss function follows almost ideally a square-root loss curve. For cables with dielectrics, the loss curve is steeper than a square-root function and, for microstrip lines, the loss versus frequency characteristic can be nearly a linear function. Accordingly, the preceding formula follows each of the transmission line models relatively closely.

In another representative embodiment, the following formula is used to model the loss associated with a network analyzer/test fixture set-up:

$$\text{Loss}(f) = a \cdot f^b + c, \quad \text{equation (2)}$$

where f is frequency and a, b, and c are constants. The parameter c is the DC loss and parameters a and b may be determined by suitably processing measurement data associated with the test fixture.

Figure 6:
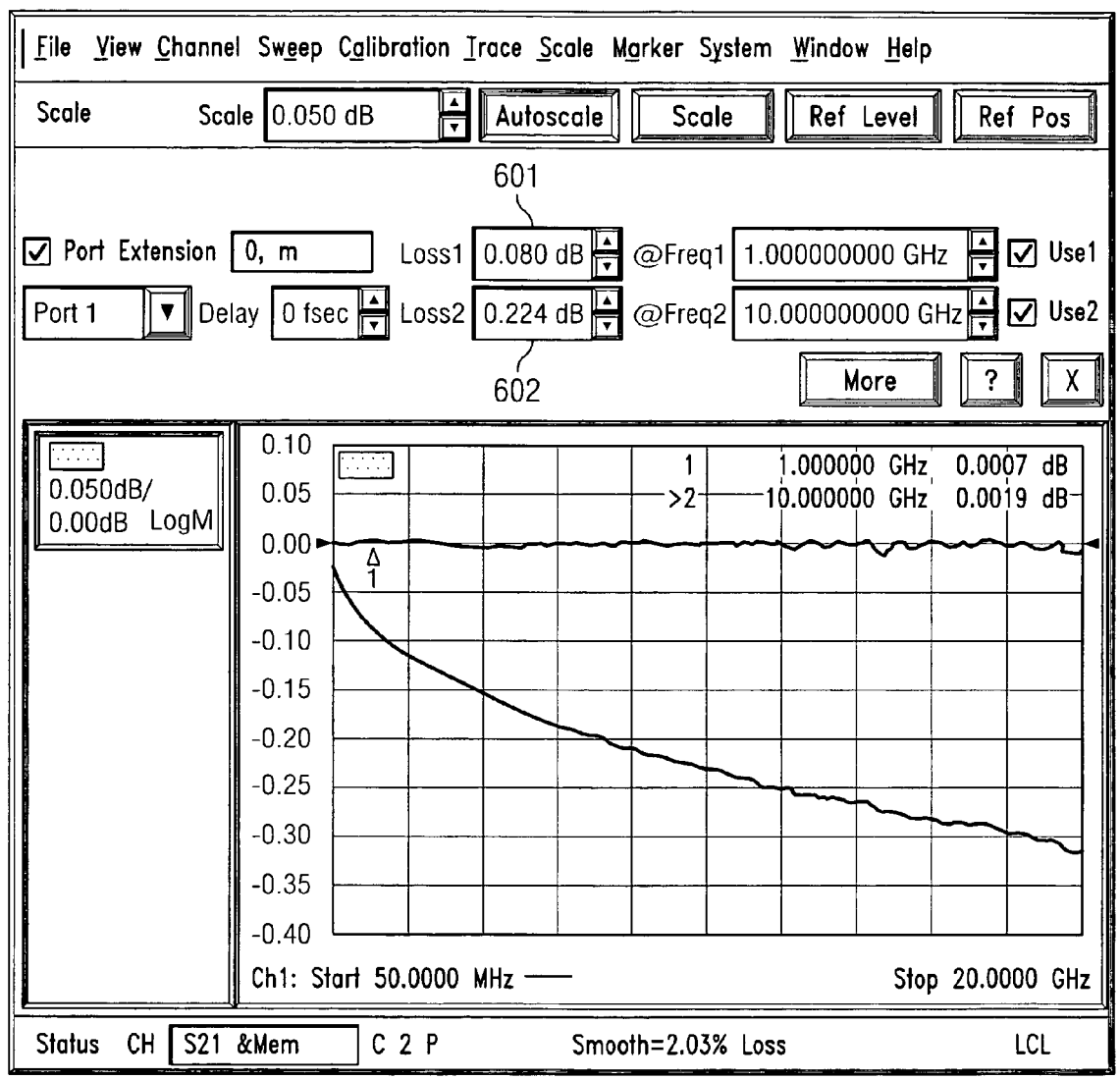
FIG. 6 depicts a graphical user interface for controlling loss compensation applied by port extension functionality according to one representative embodiment.

In some representative embodiments, the loss compensation is directly controlled by the user. For example, the user may directly input values for parameters a, b, and c using a graphical user interface (GUI). Alternatively, the user may enter the loss at one or several frequency points into GUI 600, as shown in FIG. 6, via controls 601 and 602. Software operating on the network analyzer may automatically calculate parameters a and b algebraically as will be discussed herein below. One benefit of enabling a user to change the loss compensation applied through port extension functionality is that the user may view the effect of changes as measurement data is obtained and displayed by the network analyzer in real-time.

In other representative embodiments, the parameters of the formula used to calculate the gain factors are determined in an autonomous manner by the network analyzer. Specifically, a stimulus signal is successively provided to multiple ports of a network analyzer and reflection measurements are made on each of the multiple ports. The reflection measurements are used to estimate the loss associated with the test fixture through each port. Additionally, the coaxial-to-PCB connection of the test fixtures frequently exhibits relatively poor impedance matching. A poor impedance match will result in significant ripples when the open standard is used to obtain the reflection measurements. Also, coupler/bridge directivity may introduce ripples in reflection measurements. Accordingly, some representative embodiments estimate the losses associated with multiple ports of a network analyzer coupled to a test fixture by suitably processing amplitude response values associated with multiple frequencies.

Referring now to the drawings, FIG. 1 depicts a flowchart for operation of a network analyzer according to one representative embodiment. In one representative embodiment, the flowchart is implemented using suitable software instructions or code executed by a processor of the network analyzer. In other embodiments, integrated circuitry may be alternatively or additionally employed to implement a portion of the flowchart or the entire flowchart.

In step 101, a short standard or an open standard is selected for subsequent measurements. The short standard refers to an ideal electrical connection having unity reflection with 180 degrees of phase shift. Measurements under the short standard typically obtain the response of the test fixture set-up when a suitable test kit component is inserted within the test fixture. The open standard refers to an unterminated transmission line. The open standard is measured by omitting placement of any element within the test fixture and, hence, the circuit path is "open." The selection of the standard may occur by receiving suitable input from the user of a network analyzer through a graphical user interface (GUI) or other interface. Any other suitable reflection standard can be used if the amplitude versus frequency response of the fixture is known or can be assumed.

In step 102, a port of the network analyzer is selected for calibration. In one representative embodiment, a suitable software loop selects a respective port by iteratively stepping through each port available on the device. Alternatively, the user may manually select the port through a GUI or other interface.

In step 103, a signal is generated on the selected port. In step 104, reflection measurements are made on the selected port. In step 105, the measurements are processed to determine the response across a frequency span. In step 106, the response data is stored for subsequent processing.

In step 107, a logical comparison is made to determine whether there are additional ports to be tested. If so, the process flow returns to step 102. In step 108, a logical comparison is made to determine whether to repeat the process for the other standard. If the logical comparison is true, the process flow returns to step 102 to perform the process using the other standard. In step 109, the parameters of the loss formula are calculated and used to calibrate the port extension functionality of the network analyzer.

In some representative embodiments, the parameters a, b, and c associated with equations (1) and (2) are determined algebraically using a relatively small number of measurement points. For example, for equation (1), the parameter c is determined from the measurement data as the loss at DC and the parameters a and b are determined as follows:

$$a = (L_1 f_2 - L_2 f_1)/(f_2 f_1^{1/2} - f_1 f_2^{1/2}), \quad \text{equation (3)}$$

$$b = (L_1 f_2^{1/2} - L_2 f_1^{1/2})/(f_1 f_2^{1/2} - f_2 f_1^{1/2}), \quad \text{equation (4)}$$

where $L_1$, $f_1$, and $L_2$, $f_2$ are the first and second losses and frequencies associated with the losses, respectively. In equations (3) and (4), the loss is represented in dB. If there is a DC offset (c is non-zero), then L1=Loss1−c and L2=Loss2−c, where Loss1 and Loss2 are the losses determined by the measurement data at the respective frequencies.

For equation (2), the parameter c is determined from the measurement data as the loss at DC and the parameters a and b are determined as follows:

$$a = \exp\{(\ln(f_2)\ln(L_1) - \ln(f_1)\ln(L_2))/(\ln(f_2) - \ln(f_1))\} \quad \text{equation (5)}$$

$$b = \ln(L_1/L_2)/\ln(f_1/f_2) \quad \text{equation (6)}$$

where $L_1$, $f_1$, and $L_2$, $f_2$ are the first and second losses and frequencies associated with the losses, respectively.

In another embodiment, equation (2) is used to generate the loss compensation values while only values a and c are calculated using equation (5) and the DC loss respectively. Parameter b is set to 0.5. This produces gain compensation that changes with the square root of frequency which closely models the loss of an ideal, lossy air-filled transmission line in which the loss is caused primarily by the "skin effect." In another representative embodiment, the DC loss is assumed to be negligible and parameter c is omitted or set to zero.

In alternative embodiments, the loss parameters may be stored as a factor to be multiplied by a delay term. Specifically, a standard delay or custom delay is selected through an interface of the network analyzer. The loss factors are then scaled by the selected delay thereby making the loss a function of the delay. The benefit of relating the loss to the delay in this manner is to adapt the loss between multiple test fixtures that have common properties and differ only in the length from ports to the DUT interface(s).

Figure 2:
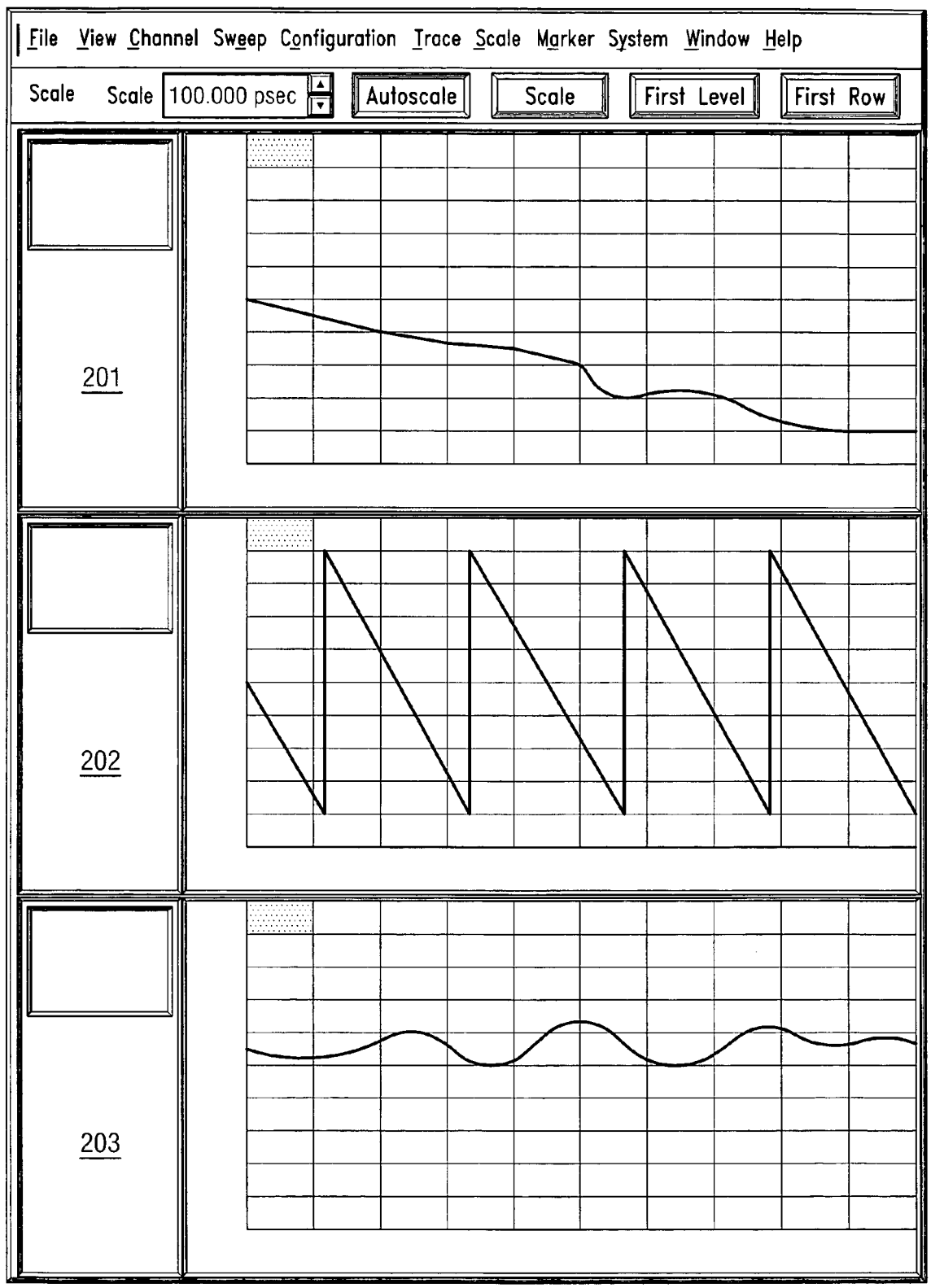
FIG. 2 depicts an amplitude response, a phase response, and a delay response of a test fixture using the open standard according to one representative embodiment.

FIG. 2 depicts amplitude response 201, phase response 202, and delay response 203 associated with reflection measurements of a test fixture using the open standard according to one representative embodiment. The responses associated with the open standard may be used as a directed normalization of the correct trace when testing of DUTs occurs. However, as seen in FIG. 2, responses 201–203 exhibit ripple. The ripples in responses 201–203 are indicative of errors caused by the poor source match (the coaxial-to-PCB connection) of the measurement system and the open response.

It is possible to appreciably mitigate the source match contribution by employing an average of the open standard and the short standard. However, in some test situations, it is not readily practical to perform measurements using the short standard and only open standard measurements are applied. Some representative embodiments process the measurement data obtained from the open standard to mitigate the errors generated by the poor source match of the test system. In some embodiments, a polynomial curve fitting algorithm or a line fitting algorithm may be applied to the amplitude response obtained from the measurement data to model the loss presented by a test fixture. The use of a polynomial or other suitable formula results in less sensitivity to ripple caused by the poor source match associated with the test fixture.

For example, the measurement data associated with a test fixture and generated using the open standard can be fitted to equation (1) by taking a change of variables such that $g=f^{1/2}$ thereby giving: $Loss(g^2)=a \cdot g + b \cdot g^2 + c$. After transforming the equation through the change in variables, a polynomial fitting algorithm may be applied to determine appropriate values for a and b. Typically, polynomial fitting algorithms calculate values a and b to minimize an error metric between the resulting polynomial and the measurement data. Such polynomial fitting algorithms are known in the art.

In another embodiment, equation (2) can be transformed into a form that enables an application of a line fitting method to be applied. The log of each side can be taken as follows: $\log(Loss(f)-c)=\log(a)+b \cdot \log(f)$. The fitting method may be applied by taking the log of the loss data (after offsetting by c) and the log of frequency. The Y-intercept of the fitted line can be mapped to a and the slope to b. Typical line fitting methods may be employed such as the least squares method.

Figure 3:
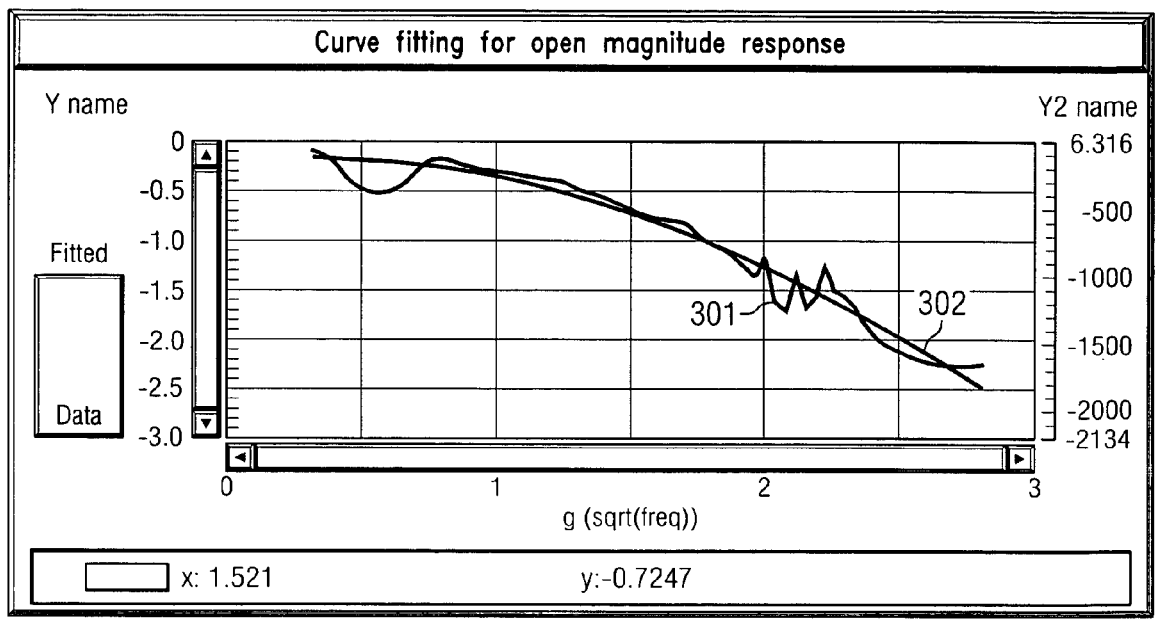
FIG. 3 depicts a graph of measurement data and a polynomial fitted to the measurement data according to one representative embodiment.

FIG. 3 depicts a graph of measurement data 301 and polynomial fitted curve 302 to the measurement data according to one representative embodiment. The measurement data 301 was obtained by measurements of a test fixture using the open standard. Curve 302 results from fitting equation (1) to the measurement data 301 using a polynomial fitting algorithm. As seen in FIG. 3, curve 302 closely approximates the measurement data 301 while omitting ripples. Accordingly, when curve 302 is used to generate amplitude compensation values for measurements of DUTs, the processed measurement values will exhibit a relatively high degree of accuracy.

Because a function is used to model the loss presented by the test fixture, it is possible that a particular frequency may be scaled by a factor that is greater than the loss presented by the test fixture. Accordingly, it is possible that the amplitude response associated with that frequency may be greater than one for certain testing procedures. Some known tests are used to determine whether a device is unstable by detecting whether the amplitude response at certain frequencies is greater than one. To prevent the loss compensation from causing a properly functioning device from failing such a test, a relatively small offset may be applied to ensure that the amplitude response of the test fixture after application of loss compensation is always less than one.

Figure 4:
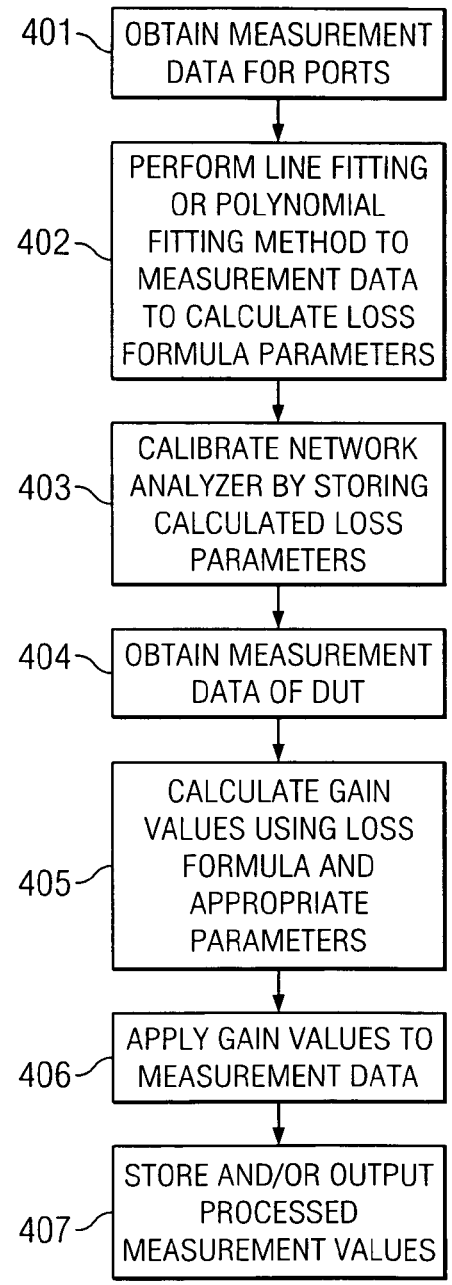
FIG. 4 depicts a flowchart for automatically calibrating a network analyzer and using the calibrated network analyzer to perform measurements of a DUT according to one representative embodiment.

FIG. 4 depicts a flowchart for automatically calibrating a network analyzer and using the calibrated network analyzer to perform measurements of a DUT according to one representative embodiment. In one representative embodiment, the flowchart is implemented using suitable software instructions or code executed by a processor of the network analyzer. In other embodiments, integrated circuitry may be alternatively or additionally employed to implement a portion of or the entire flowchart.

In step 401, measurement data of a test fixture using the open standard is obtained for the ports of the network analyzer. In step 402, a line fitting method or a polynomial fitting method is applied to the measurement data to calculate parameters for the loss formula. In step 403, the network analyzer is calibrated by storing the calculated loss parameters. In step 404, measurement data of a DUT is obtained. In step 405, gain values are calculated using the appropriate parameters. For example, suppose that the measurement values of interest are $S_{12}$ measurements (i.e., a stimulus signal is applied to port one and the output signal from port two is measured). The parameters for port one and for port two are retrieved. For each frequency of interest, a first gain value is calculated using the parameters for port one and a second gain value is calculated using the parameters for port two. The gain values are then applied to the measurement data. Using the $S_{12}$ example, the amplitude measurement values are multiplied by the previously mentioned first and second gain values. In step 407, the processed measurement values are stored and/or output as appropriate (e.g., used to display an amplitude response of the DUT on the screen of the network analyzer).

Figure 5:
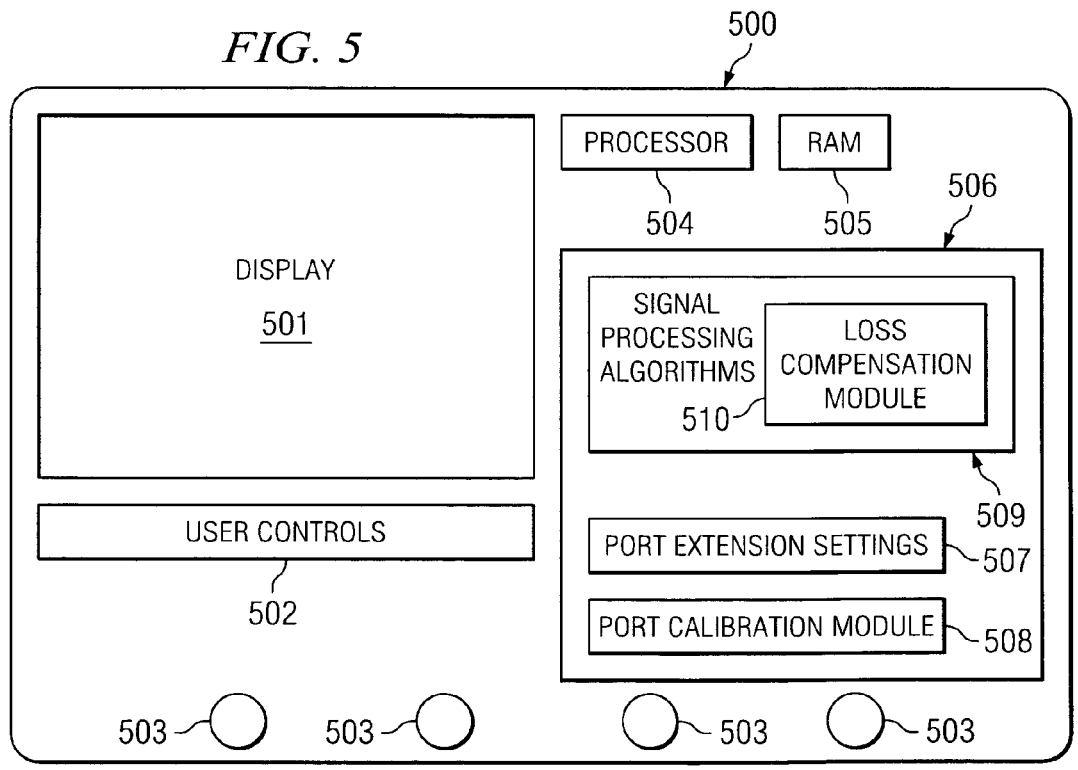
FIG. 5 depicts a block diagram of a network analyzer according to one representative embodiment.

FIG. 5 depicts a block diagram of network analyzer 500 according to one representative embodiment. Network analyzer 500 includes typical elements common to network analyzers. For example, network analyzer 500 includes processor 504 to control the operations of network analyzer 500. Network analyzer 500 further includes memory 505 to store measurement data for processing. Network analyzer 500 includes display 501 for presenting measurement data, user interfaces, and/or the like and user controls 502 to enable user control over the operations of network analyzer 500. Network analyzer 500 includes multiple coaxial or other ports 503 to generate signals for application to a DUT and to receive signals from a DUT during test operations.

Network analyzer 500 includes suitable logic to apply port extension functionality to compensate for loss associated with a test fixture and logic for automatically calibrating the port extension functionality. For example, non-volatile memory 506 may be used to store software instructions or code that define the operations of network analyzer 500. Non-volatile memory 506 includes signal processing algorithms 509 that perform spectral analysis of measurement data. Signal processing algorithms 509 include loss compensation module 510 according to one representative embodiment. Loss compensation module 510 implements the application of gain to measurement data according to port extension functionality. Specifically, loss compensation module 510 retrieves appropriate parameters from port extension settings 507. Compensation module 510 uses the retrieved parameters to calculate gain values on a frequency dependent basis. Non-volatile memory 506 further includes port extension calibration module 508 that measures reflection signals from ports 503 and automatically calculates port extension settings 507 after processing of the measurement data.

What is claimed is:

1. A method of operating a network analyzer, comprising:
    applying a stimulus signal on at least one port of said network analyzer for provision to a device under test (DUT) within a test fixture coupled to said network analyzer;
    generating measurement data from said DUT in response to said stimulus signal on at least one port of said network analyzer; and
    generating an amplitude response of said DUT across a frequency range, wherein a port extension module of said network analyzer automatically applies loss compensation to said amplitude response in a manner that is non-linearly related to frequency according to at least one controllable parameter.

2. The method of claim 1 wherein said port extension calculates loss compensation values using the formula:

$$a \cdot f^{1/2} + b \cdot f,$$

wherein a and b are parameters and f is a variable representing frequency.

3. The method of claim 2 wherein said port extension further calculates said loss compensation values by adding a DC loss value to said formula.

4. The method of claim 1 wherein said port extension calculates loss compensation values using the formula:

$$a \cdot f^b,$$

wherein a and b are parameters and f is a variable representing frequency.

5. The method of claim 4 wherein parameters a and b are controllable.

6. The method of claim 4 wherein said port extension further calculates said loss compensation values by adding a DC loss value to said formula.

7. The method of claim 1 wherein said port extension module calculates a first loss compensation value associated with a first port to which said stimulus signal is applied and a second loss compensation value associated with a second port on which measurements are made.

8. The method of claim 1 further comprising:
    receiving, by the network analyzer, input from the user to modify said controllable parameter.

9. The method of claim 8 further comprising:
    repeating said applying, generating measurement data, and generating an amplitude response in response to said modified controllable parameter during real-time operation of said network analyzer.

10. The method of claim 1 further comprising:
    receiving, by the network analyzer, input from the user to cause said network analyzer to automatically calibrate said controllable parameter.

11. The method of claim 1 wherein said controllable parameter is automatically modified by said network analyzer in response to a user modifying a delay value associated with said port extension module.

12. The method of claim 1 wherein said controllable parameter is calculated by multiplying a loss parameter by a delay value associated with said port extension module.

13. A method of calibrating a network analyzer, comprising:
    applying a stimulus signal on a port of said network analyzer for provision to a test fixture coupled to said network analyzer;
    generating measurement data from said test fixture in response to said stimulus signal on said port of said network analyzer;
    generating an amplitude response of said test fixture across a frequency range;
    applying, by a port extension calibration module of said network analyzer, a parameter fitting algorithm to said amplitude response using a function of frequency characterized by a plurality of parameters; and
    configuring a port extension module to apply loss compensation to measurements associated with said port on a non-linear frequency dependent basis according to said function and said plurality of parameters determined by said fitting algorithm.

14. The method of claim 13 wherein said function is given by:

$$a \cdot f^{1/2} + b \cdot f,$$

wherein a and b are parameters and f is a variable representing frequency.

15. The method of claim 14 wherein said fitting algorithm is a polynomial fitting algorithm.

16. The method of claim 14 further comprising:
    calculating a DC loss value for addition to said function, wherein said configuring adjusts said port extension module to apply loss compensation using said DC loss value.

17. The method of claim 16 wherein said calculating a DC loss value includes determining an offset to prevent a loss compensated amplitude response of said test fixture from being greater than one.

18. The method of claim 13 wherein said function is given by:

$$a \cdot f^b,$$

wherein a and b are parameters and f is a variable representing frequency.

19. The method of claim 18 wherein said fitting algorithm is a line fitting algorithm.

20. The method of claim 18 further comprising:
    calculating a DC loss value for addition to said function, wherein said configuring adjusts said port extension module to apply loss compensation using said DC loss value.

21. The method of claim 20 wherein said calculating a DC loss value includes determining an offset to prevent a loss compensated amplitude response of said test fixture from being greater than one.

22. The method of claim 13 wherein said measurement data is obtained using an open standard.

23. The method of claim 13 wherein said measurement data is obtained using a short standard.

24. The method of claim 13 wherein said measurement data is an average of measurement data obtained using a short standard and an open standard.

25. A method of calibrating a network analyzer, comprising:
applying a stimulus signal on a port of said network analyzer for provision to a test fixture coupled to said network analyzer;
generating measurement data from said test fixture in response to said stimulus signal on said port of said network analyzer;
generating an amplitude response of said test fixture across a frequency range;
applying, by a port extension calibration module of said network analyzer, at least one loss value to a first function to derive a parameter at least partially characterizing said amplitude response of test fixture; and
configuring a port extension module to apply loss compensation to measurements associated with said port on a non-linear frequency dependent basis according to a second function that is a function of frequency and is at least partially characterized by at least said parameter.

26. The method of claim 25 wherein said second function is given by:

$a \cdot f^{1/2} + b \cdot f$, wherein a and b are parameters and f is a variable representing frequency.

27. The method of claim 26 wherein parameters a and b are determined by the following equations:

$a = (L_1 f_2 - L_2 f_1)/(f_2 f_1^{1/2} - f_1 f_2^{1/2})$, and $b = (L_1 f_2^{1/2} - L_2 f_1^{1/2})/(f_1 f_2^{1/2} - f_2 f_1^{1/2})$, wherein $L_1$ and $L_2$ are loss values and $f_1$ and $f_2$ are frequencies corresponding to said loss values.

28. The method of claim 26 further comprising:
calculating a DC loss value for addition to said second function, wherein said configuring adjusts said port extension module to apply loss compensation using said DC loss value.

29. The method of claim 28 wherein said calculating a DC loss value includes determining an offset to prevent a loss compensated amplitude response of said test fixture from being greater than one.

30. The method of claim 25 wherein said second function is given by:

$a \cdot f^b$, wherein a and b are parameters and f is a variable representing frequency.

31. The method of claim 30 wherein parameters a and b are determined by the following equations:

$a = \exp\{(\ln(f_2)\ln(L_1) - \ln(f_1)\ln(L_2))/(\ln(f_2) - \ln(f_1))\}$, and $b = \ln(L_1/L_2)/\ln(f_1/f_2)$, wherein $L_1$ and $L_2$ are loss values and $f_1$ and $f_2$ are frequencies corresponding to said loss values.

32. The method of claim 30 further comprising:
calculating a DC loss value for addition to said second function, wherein said configuring adjusts said port extension module to apply loss compensation using said DC loss value.

33. The method of claim 32 wherein said calculating a DC loss value includes determining an offset to prevent a loss compensated amplitude response of said test fixture from being greater than one.

34. The method of claim 25 wherein said measurement data is obtained using an open standard.

35. The method of claim 25 wherein said measurement data is obtained using a short standard.

36. The method of claim 25 wherein said measurement data is an average of measurement data obtained using a short standard and an open standard.

37. A network analyzer, comprising:
a plurality of ports for application of stimulus signals to a device under test (DUT) and for measuring signals from said DUT;
signal processing logic for performing spectral analysis of measurements made on said plurality of ports, wherein said signal processing logic applies port extension loss compensation to amplitude data generated by said spectral analysis;
logic for processing reflection measurement data, during a calibration mode of said network analyzer, to generate estimates of loss associated with a test fixture; and
logic for adjusting port extension settings in response to said logic for processing.

38. The network analyzer of claim 37 wherein said signal processing logic evaluates a function is given by:

$a \cdot f^{1/2} + b \cdot f$, wherein a and b are said parameters and f is a variable representing frequency.

39. The network analyzer of claim 37 wherein said logic for processing applies a polynomial fitting algorithm.

40. The method of claim 38 further comprising:
calculating a DC loss value for addition to said function for said port extension loss compensation.

41. The method of claim 40 wherein said calculating a DC loss value includes determining an offset to prevent a loss compensated amplitude response of said test fixture from being greater than one.

42. The network analyzer of claim 37 wherein said signal processing logic evaluates a function is given by:

$a \cdot f^b$, wherein a and b are parameters and f is a variable representing frequency.

43. The network analyzer of claim 42 wherein said logic for processing applies a line fitting algorithm.

44. The method of claim 42 further comprising:
calculating a DC loss value for addition to said function for said port extension loss compensation.

45. The method of claim 44 wherein said calculating a DC loss value includes determining an offset to prevent a loss compensated amplitude response of said test fixture from being greater than one.

* * * * *

UNITED STATES PATENT AND TRADEMARK OFFICE
CERTIFICATE OF CORRECTION

PATENT NO. : 7,054,780 B2  
APPLICATION NO. : 10/939861  
DATED : May 30, 2006  
INVENTOR(S) : Dunsmore et al.

It is certified that error appears in the above-identified patent and that said Letters Patent is hereby corrected as shown below:

In column 9, line 35, in Claim 27, delete "$a=(L_1f_2-L_2f_1)/(f_2f_1^{1/2}- f_1f_2^{1/2})$, and" and insert -- $a=(L_1f_2-L_2f_1)/(f_2f_1^{1/2}- f_1f_2^{1/2})$, and --, therefor.

In column 9, line 37, in Claim 27, delete "$b=(L_1f_2^{1/2}-L_2 f_1^{1/2})/(f_1f_2^{1/2}- f_2f_1^{1/2})$," and insert -- $b=(L_1f_2^{1/2}-L_2f_1^{1/2})/(f_1f_2^{1/2}-f_2f_1^{1/2})$, --, therefor.

In column 9, line 58, in Claim 31, delete "$a=\exp\{(\ln(f_2)\ln(L_1)-\ln(f_1)\ln(L_2))/(\ln(f_2)-\ln(f_1)\}$, and" and insert -- $a=\exp\{(\ln(f_2)\ln(L_1)-\ln(f_1)\ln(L_2))/(\ln(f_2)-\ln(f_1))\}$, --, therefor.

In column 9, line 60, in Claim 31, delete "$b=\ln(L_1/L_2)/\ln(f_1/f_2)$," and insert -- $b=\ln(L_1/L_2)/\ln(f_1/f_2)$, --, therefor.

Signed and Sealed this

Third Day of October, 2006

JON W. DUDAS  
*Director of the United States Patent and Trademark Office*